United States Patent
Codding et al.

(10) Patent No.: US 7,572,739 B2
(45) Date of Patent: Aug. 11, 2009

(54) TAPE REMOVAL IN SEMICONDUCTOR STRUCTURE FABRICATION

(75) Inventors: Steven R. Codding, Underhill, VT (US); Timothy C Krywanczyk, Essex Junction, VT (US); Steven G. Perrotte, Winooski, VT (US); Jason P. Ritter, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 774 days.

(21) Appl. No.: 10/905,914

(22) Filed: Jan. 26, 2005

(65) Prior Publication Data

US 2006/0163204 A1    Jul. 27, 2006

(51) Int. Cl.
*H01L 21/302* (2006.01)
*H01L 21/461* (2006.01)

(52) U.S. Cl. .............. 438/745; 438/612; 438/455; 438/758

(58) Field of Classification Search .......... 438/745, 438/612, 455, 758; 216/83; 156/345.11
See application file for complete search history.

(56) References Cited

U.S. PATENT DOCUMENTS

| 5,597,420 | A | 1/1997 | Ward | |
|---|---|---|---|---|
| 6,319,884 | B2 | 11/2001 | Leduc et al. | |
| 6,337,288 | B1* | 1/2002 | Ohya et al. | 438/758 |
| 2002/0068384 | A1* | 6/2002 | Beroz et al. | 438/111 |
| 2002/0068453 | A1* | 6/2002 | Grigg et al. | 438/690 |
| 2003/0087179 | A1* | 5/2003 | Iwasaki | 430/166 |
| 2004/0126575 | A1* | 7/2004 | Yoshida et al. | 428/343 |

* cited by examiner

*Primary Examiner*—Nadine G Norton
*Assistant Examiner*—Mahmoud Dahimene
(74) *Attorney, Agent, or Firm*—Schmeiser, Olsen & Watts; William D. Sabo

(57) ABSTRACT

A semiconductor structure fabrication method for removing a tape physically attached to a device side of the semiconductor substrate by an adhesive layer of the tape, wherein the adhesive layer comprises an adhesive material. The method includes the step of submerging the tape in a liquid chemical comprising monoethanolamine or an alkanolamine for a pre-specified period of time sufficient to allow for a separation of the tape from the semiconductor substrate without damaging devices on the semiconductor substrate.

12 Claims, 2 Drawing Sheets

TAPE REMOVAL IN SEMICONDUCTOR STRUCTURE FABRICATION

BACKGROUND OF THE INVENTION

1. Technical Field

The present invention relates to tape removal, and more particularly, to tape removal in semiconductor structure fabrication.

2. Related Art

In a typical semiconductor structure fabrication process, a wafer can be coated with a UV (Ultraviolet) tape on the wafer's device side (i.e., the top side) so as to protect the devices on the wafer while the wafer's other side (i.e., the bottom side) can be grinded so as to make the wafer thinner. After that, the UV tape can be exposed to UV light so as to make the UV tape come off the wafer without causing any damage to the devices on the wafer. However, during the grinding process, the UV tape may be subjected to high temperatures which can cause the UV tape to lose such a characteristic (i.e., the characteristic of detaching itself from the wafer after being exposed to UV light). If so, trying to remove the UV tape from the wafer may cause damage to the devices on the wafer. As a result, there is a need for a novel method for removing the UV tape from the device side of the wafer essentially without causing any damage to the devices on the wafer.

SUMMARY OF THE INVENTION

The present invention provides a semiconductor structure fabrication method, comprising (a) providing (i) a semiconductor substrate and (ii) a tape physically attached to a device side of the semiconductor substrate by an adhesive layer of the tape, wherein the adhesive layer comprises an adhesive material; and (b) submerging the tape in a liquid chemical comprising monoethanolamine for a pre-specified period of time sufficient to allow for a separation of the tape from the semiconductor substrate without damaging devices on the semiconductor substrate.

The present invention also provides a semiconductor structure fabrication method, comprising (a) providing (i) a semiconductor substrate and (ii) a tape physically attached to a device side of the semiconductor substrate by an adhesive layer of the tape, wherein the adhesive layer comprises an adhesive material; and (b) submerging the tape in a liquid chemical comprising an alkanolamine for a pre-specified period of time sufficient to allow for a separation of the tape from the semiconductor substrate without damaging devices on the semiconductor substrate.

The present invention also provides an apparatus, comprising (a) a semiconductor substrate and a tape physically attached to a device side of the semiconductor substrate by an adhesive layer of the tape, wherein the adhesive layer comprises an adhesive material; and (b) a body of a liquid chemical comprising essentially only monoethanolamine, wherein the tape is submerged in the body of the liquid chemical.

The present invention provides a novel method for removing the UV tape from the device side of the wafer essentially without causing any damage to the devices on the wafer.

DETAILED DESCRIPTION OF THE INVENTION

Figure 1:
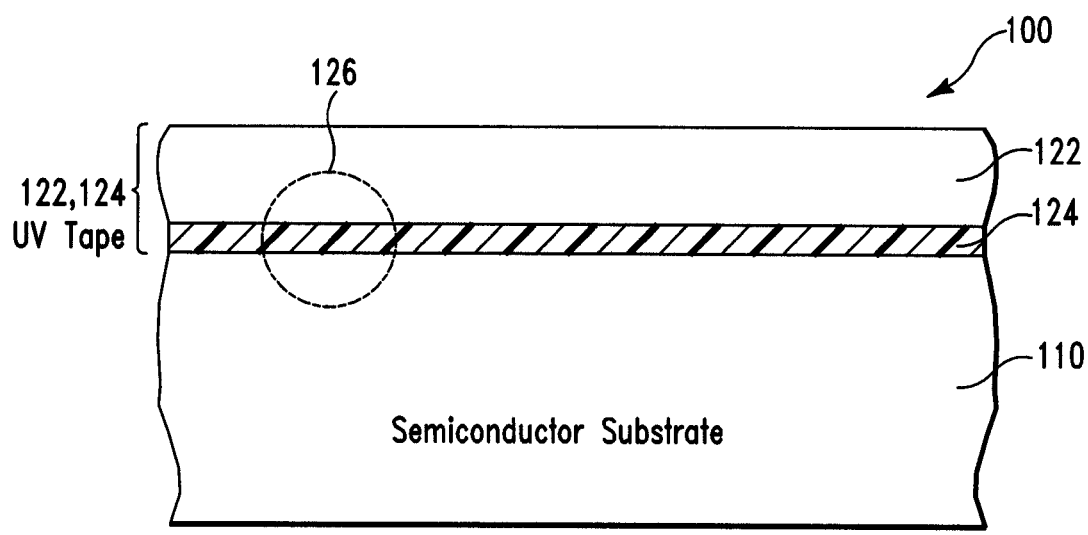
FIG. 1 illustrates a semiconductor structure, in accordance with embodiments of the present invention.

FIG. 1 illustrates a cross section view of a semiconductor structure 100, in accordance with embodiments of the present invention. The semiconductor structure 100 can comprise a semiconductor substrate 110 coated on top with a UV (Ultraviolet) tape 122,124. In other words, the UV tape 122,124 is physically attached to the device side of the semiconductor substrate 110. The device side is the side of the semiconductor substrate 110 on which semiconductor devices (e.g., transistors, resistors, capacitors, etc.) are fabricated. Coating the device side of the semiconductor substrate 110 with the UV tape 122,124 can protect the devices on the device side of the semiconductor substrate 110 (i) while the semiconductor substrate 110 is back grinded on the bottom side (opposite to the device side) to make the semiconductor substrate 110 thinner or (ii) while the semiconductor substrate 110 is cut into chips on the bottom side (called chip dicing).

In one embodiment, the UV tape 122,124 can comprise a frame layer 122 and an adhesive layer 124 physically attaching the frame layer 122 to the semiconductor substrate 110. The adhesive layer 124 can comprise an adhesive material that is capable of attaching itself to a rugged surface of an object (not shown). The adhesive material can have a gel state and is capable of attaching itself to the rugged surface of the object by filling tiny holes and trenches at the rugged surface.

Figure 2:
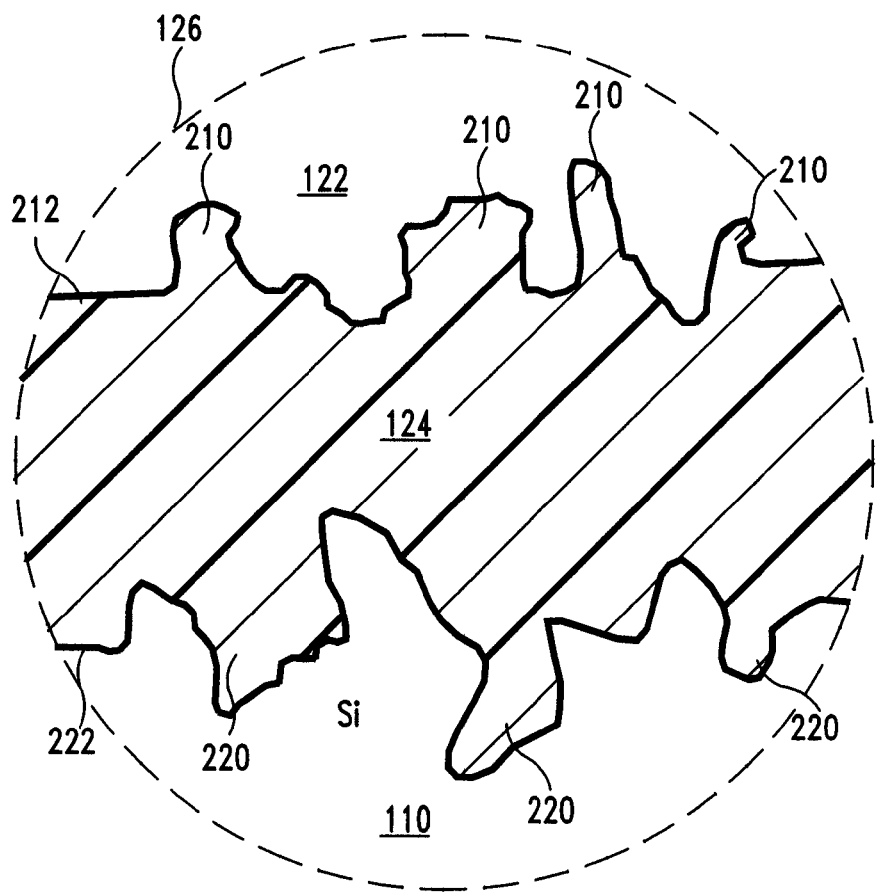
FIG. 2 is an enlarged view of a region of the semiconductor structure of FIG. 1, in accordance with embodiments of the present invention.

FIG. 2 illustrates an enlarged view of a region 126 of FIG. 1. It can be seen from FIG. 2 that the adhesive layer 124 physically attaches the frame layer 122 to the semiconductor substrate 110 by filling tiny holes 210 at the surface 212 of the frame layer 122 and by filling tiny holes 220 at the surface 222 of the semiconductor substrate 110.

In one embodiment, the adhesive material of the UV tape 122,124 can have a characteristic of contracting (reduction in size) and losing elasticity when being exposed to UV light. As a result, in one embodiment, the UV tape 122,124 can be removed from the semiconductor substrate 110 by first exposing the UV tape 122,124 to UV light (the frame layer 122 can comprise a material transparent to UV light so that UV light can reach the adhesive layer 124). Then, the UV tape 122,124 can be peeled off the semiconductor substrate 110 essentially without damaging the devices on the semiconductor substrate 110.

Alternatively, the UV tape 122,124 can be removed from the semiconductor substrate 110 by submerging the semiconductor substrate 110 coated with the UV tape 122,124 in 100% monoethanolamine ($NH_2$—$CH_2$—$CH_2$—H) in room conditions (23° C. temperature, 1 atm pressure) for 4 to 6 hours. As a result, the UV tape 122,124 comes off the semiconductor substrate 110 by itself or can be peeled off the semiconductor substrate 110 without damaging the devices on the semiconductor substrate 110.

Figure 3:
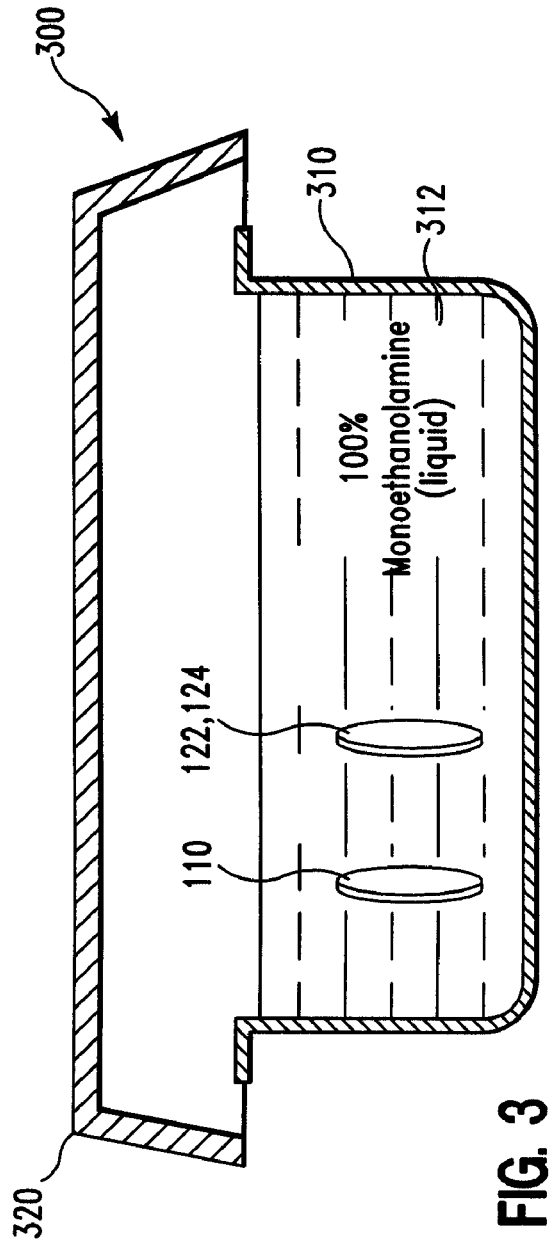
FIG. 3 illustrates an apparatus for removing a UV (Ultraviolet) tape from the semiconductor structure of FIG. 1, in accordance with embodiments of the present invention.

FIG. 3 illustrates an apparatus 300 for removing the UV tape 122,124 from the semiconductor structure 110 of FIG. 1, in accordance with embodiments of the present invention. Illustratively, the apparatus 300 can comprise a vessel 310 and an exhaust hood 320 positioned directly above the vessel 310. The vessel 310 can contain 100% monoethanolamine 312. The semiconductor substrate 110 coated with the UV tape 122,124 can be submerged in the monoethanolamine 312 in room conditions (23° C. temperature, 1 atm pressure) for 4 to 6 hours. As a result, the UV tape 122,124 comes off semiconductor substrate 110 by itself as seen in FIG. 3 or can be peeled off the semiconductor substrate 110 without damaging the devices on the semiconductor substrate 110. The exhaust hood 320 can be used to collect any released gases that may be created in the process (i.e., submerging in the vessel).

The inventors of the present invention have found that if the semiconductor substrate 110 coated with the UV tape 122, 124 is submerged in the monoethanolamine 312 for more than 6 hours, the devices at top of the semiconductor substrate 110 can be damaged by the monoethanolamine. However, if the semiconductor substrate 110 coated with the UV tape 122, 124 is submerged in the monoethanolamine 312 for less than 4 hours, it is likely that the UV tape 122,124 does not come off the semiconductor substrate 110 by itself, and trying to peel the UV tape 122,124 off the semiconductor substrate 110 may damage the devices at top of the semiconductor substrate 110.

The inventors of the present invention have also found that if the semiconductor substrate 110 coated with the UV tape 122,124 is submerged in the monoethanolamine 312 in room conditions for 4 to 6 hours, the UV tape 122,124 comes off the semiconductor substrate 110 by itself or can be peeled off the semiconductor substrate 110 without damaging the devices on the semiconductor substrate 110, even if the UV tape 122,124 has earlier been (i) exposed to UV light or (ii) subjected to high temperatures (i.e., above 100° C.), or both (i) and (ii).

The effect of monoethanolamine can be explained as follows. When the semiconductor substrate 110 coated with the UV tape 122,124 is submerged in the monoethanolamine 312, monoethanolamine chemically reacts with and breaks Ester bonds (—COOH—) in the adhesive material of the adhesive layer (FIGS. 1 and 2) causing the adhesive material to disintegrate. As a result, the UV tape 122,124 comes off the semiconductor substrate 110 by itself or can be peeled off the semiconductor substrate 110 without damaging the devices on the semiconductor substrate 110.

Figure 4:
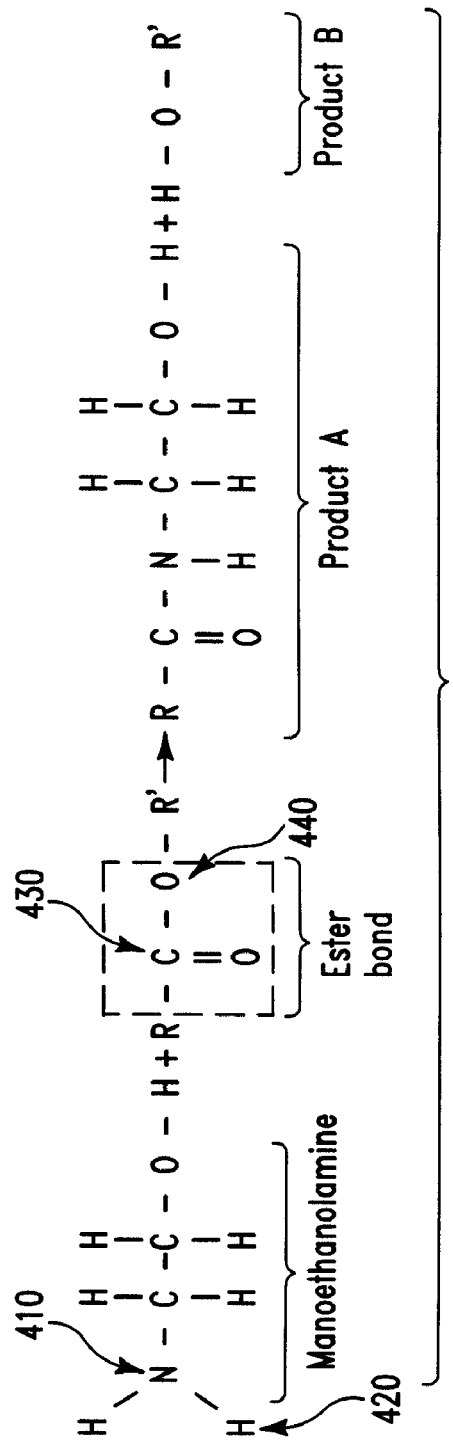
FIG. 4 illustrates a chemical reaction associated with the operation of the apparatus of FIG. 3, in accordance with embodiments of the present invention.

FIG. 4 illustrates the chemical reaction between a monoethanolamine atom and an Ester bond. The letters C, H, O, and N represent carbon, hydrogen, oxygen, and nitrogen atoms, respectively. R and R' each represents a group of atoms. R and R' may or may not have chemical bond(s) with each other besides via the —COO— Ester bond. The chemical reaction between the monoethanolamine atom and the Ester bond can be described as follows. The N atom 410 releases an H atom 420 so that the N atom can attach to the C atom 430 of the Ester bond thereby breaking the single bond between the C atom 430 and the O atom 440 and forming the product A in the process. The released H atom 420 combines with the O—R' group to form product B. With the Ester bonds in the adhesive material of the adhesive layer 124 being broken, with reference to FIG. 2, the adhesive layer 124 disintegrates and the UV tape 122,124 comes off the semiconductor substrate 110 by itself or can be peeled off the semiconductor substrate 110 without damaging the devices on the semiconductor substrate 110.

Monoethanolamine diluted in water can have the same effect (i.e., the removal of the UV tape 122,124) as 100% monoethanolamine, although it may take longer (i.e., longer than 6 hours) to get the same result as in the case in which 100% monoethanolamine is used. Ambient temperature and pressure conditions other than room conditions may accelerate or delay the final result (i.e., the removal of the UV tape 122,124) compared with from 4 to 6 hours if the removal process is performed in room conditions (23° C. temperature, 1 atm pressure).

In the embodiments above, monoethanolamine is used to remove the UV tape 122,124 (FIG. 1). In general, monoethanolamine can be used to remove any tape from the semiconductor substrate 110 if the tape is physically attached to the semiconductor substrate 110 by an adhesive material that disintegrates when chemically reacting with monoethanolamine.

In the embodiments above, monoethanolamine is used to remove the UV tape 122,124 (FIG. 1). In general, another alkanolamine can be used. An alkanolamine can be defined as having the formular: $H_{3-n}N[(CH_2)_m(HCOH)(R)]_n$, wherein m can be 1 or 2, R can be H or $C_1$-$C_3$ alkyl, and n can be 1, 2, or 3. For example, when m=n=1, the alkanolamine is monoethanolamine.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor structure fabrication method, comprising:
   (a) providing (i) a semiconductor substrate and (ii) a tape physically attached to a device side of the semiconductor substrate by an adhesive layer of the tape, wherein the adhesive layer comprises an adhesive material, and wherein the adhesive material comprises ester bonds; and
   (b) submerging the tape in a liquid chemical comprising monoethanolamine for a pre-specified period of time sufficient to allow for a separation of the tape from the semiconductor substrate without damaging devices on the semiconductor substrate.

2. The method of claim 1, further comprising the step of, before step (b) is performed, exposing the adhesive layer to ultraviolet light.

3. The method of claim 1, further comprising the step of, before step (b) is performed, subjecting the adhesive layer to high temperatures.

4. The method of claim 1, further comprising the steps of, before step (b) is performed:
   subjecting the adhesive layer to heat; and
   exposing the adhesive layer to ultraviolet light.

5. The method of claim 1, wherein the liquid chemical comprises essentially only monoethanolamine.

6. The method of claim 5, wherein the pre-specified period of time is in a range of 4 to 6 hours, and wherein step (b) is performed in room conditions.

7. The method of claim 1, wherein the liquid chemical comprises essentially only water and monoethanolamine.

8. The method of claim 1, wherein the adhesive material has a characteristic of disintegrating in response to being in direct physical contact with monoethanolamine.

9. The method of claim 8, wherein the adhesive material has a characteristic of contracting and losing elasticity in response to being exposed to ultraviolet (UV) light.

10. A semiconductor structure fabrication method, comprising:
   (a) providing (i) a semiconductor substrate and (ii) a tape physically attached to a device side of the semiconductor substrate by an adhesive layer of the tape, wherein the adhesive layer comprises an adhesive material, and wherein the adhesive material comprises ester bonds; and (b) submerging the tape in a liquid chemical comprising an alkanolamine for a pre-specified period of time sufficient to allow for a separation of the tape from the semiconductor substrate without damaging devices on the semiconductor substrate.

11. The method of claim 10, further comprising the step of, before step (b) is performed, exposing the adhesive layer to ultraviolet light.

12. The method of claim 10, further comprising the step of, before step (b) is performed, subjecting the adhesive layer to high temperatures.

* * * * *